United States Patent
Wei

(10) Patent No.: US 6,624,764 B2
(45) Date of Patent: Sep. 23, 2003

(54) SIGNAL TRANSMISSION DEVICE FOR MINIMIZING SIMULTANEOUS SWITCHING NOISE IN INTEGRATED CIRCUIT CHIP AND THE SIGNAL TRANSMISSION METHOD THEREOF

(75) Inventor: Yi-Kuang Wei, Taipei (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 10/135,414

(22) Filed: Apr. 30, 2002

(65) Prior Publication Data

US 2003/0016049 A1 Jan. 23, 2003

(30) Foreign Application Priority Data

Jul. 23, 2001 (TW) ........................................ 90117952 A

(51) Int. Cl.[7] ................................................. H03M 5/00
(52) U.S. Cl. ........................................... 341/59; 341/58
(58) Field of Search ............................... 341/58, 59, 50

(56) References Cited

U.S. PATENT DOCUMENTS 5,703,580 A * 12/1997 Ko ............................... 341/59
5,805,087 A * 9/1998 Walker ........................ 341/95
6,195,764 B1 * 2/2001 Caldara et al. ............... 714/30
6,425,107 B1 * 7/2002 Caldara et al. ............. 714/759

* cited by examiner

Primary Examiner—Peguy JeanPierre
(74) Attorney, Agent, or Firm—Volpe and Koenig, P.C.

(57) ABSTRACT

A signal transmission device which transmits n-bit parallel digital signals through an I/O driver to minimize simultaneous switching noise in an integrated circuit chip is proposed. The signal transmission device includes an encoder coupled to the I/O driver which receives the n-bit parallel digital signals and performs an encoding operation to the n-bit parallel digital signals to provide encoded m-bit parallel digital signals for the I/O driver, where m>n and the encoding operation is performed by a rule that the number of logic-1 bits of the encoded m-bit parallel digital signals is maintained at p and the number of logic-0 bits of the encoded m-bit parallel digital signals is maintained at (m−p), where $C_p^m > 2^n$ and m>p>0, and a decoder coupled to the I/O driver which receives the encoded m-bit parallel digital signals and performs a decoding operation to the encoded m-bit parallel digital signals to restore the n-bit parallel digital signals.

28 Claims, 4 Drawing Sheets

SIGNAL TRANSMISSION DEVICE FOR MINIMIZING SIMULTANEOUS SWITCHING NOISE IN INTEGRATED CIRCUIT CHIP AND THE SIGNAL TRANSMISSION METHOD THEREOF

FIELD OF THE INVENTION

The present invention is related to a signal transmission device for minimizing simultaneous switching noise in integrated circuit chip (ICs), and in particular, to a signal transmission device which transmits n-bit parallel digital signals through an I/O driver to minimize simultaneous switching noise in integrated circuit chip and the signal transmission method thereof.

BACKGROUND OF THE INVENTION

In an integrated circuit chip, there is bound to proceed with a great deal of data transmissions and data processing tasks. With the increasing processing speed and data transmission rate and the decreasing rated working voltage for an integrated circuit, the inductance effect of the power/ground pads, especially wire-bond pads, in an integrated circuit chip is becoming more and more serious. FIG. 1(a) shows an equivalent circuit diagram in which a plurality of power pads 11 and ground pads 12 are used to interconnect an I/O driver including N I/O buffers 13 with a common power bus $V_{cc}$ and a common ground bus GND, wherein the power pads 11 and the ground pads 12 are respectively represented by a parasitic inductor $L_1$ and a parasitic inductor $L_2$ as their parallel equivalent circuit elements, as shown in FIG. 1(b). Because the voltage $V_{L1}$ across the inductors $L_1$ and the voltage $V_{L2}$ across the inductor $L_2$ are directly proportional to the variation of the current flowing therethrough (V=Ldi/dt), while a large number of I/O buffers 13 are switching logic states simultaneously in the same direction, the variation of the current flowing through the inductors $L_1$ or $L_2$ will increase to cause the voltages $V_{L1}$ or $V_{L2}$ to increase, so that the voltage $V_{N1}$ at node $N_1$ or the voltage $V_{N2}$ at node $N_2$ will decrease as well. A surge of instantaneous current will be developed to flow through the I/O buffers 13, and thus power/ground noise will be generated in the power bus $V_{CC}$ and the ground bus GND. This noise is called simultaneous switching noise (SSN), commonly referred to as "ground/power bounce". The simultaneous switching noise is subject to deteriorate the signal transmission quality and lead the I/O buffers 13 to false switching operations. In view of the adverse effect of the simultaneous switching noise, how to minimize the simultaneous switching noise in an integrated circuit chip is a major object of the present invention.

SUMMARY OF THE INVENTION

A first respect of the present invention is directed to a signal transmission device for transmitting n-bit parallel digital signals through an I/O driver to minimize simultaneous switching noise in an integrated circuit chip. The signal transmission device according to a first respect of the present invention includes: an encoder coupled to the I/O driver which receives the n-bit parallel digital signals and performs an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is maintained at p and the number of logic-0 bits of the encoded m-bit parallel digital signals is maintained at (m–p), where $C_p^m > 2^n$ and m>p>0, and a decoder coupled to the I/O driver which receives the encoded m-bit parallel digital signals and performs a decoding operation to the encoded m-bit parallel digital signals, so as to restore the n-bit parallel digital signals.

A second respect of the present invention is directed to a signal transmission device which transmits n-bit parallel digital signals through an I/O driver to reduce simultaneous switching noise in an integrated circuit chip. The signal transmission device according to a second respect of the present invention includes: an encoder coupled to the I/O driver which receives the n-bit parallel digital signals and performs an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is maintained at either p or p+1 and the number of logic-0 bits of the encoded m-bit parallel digital signals is maintained at either (m–p) or (m–p–1), where $(C_p^m + C_{p+1}^m) > 2^n$ and m>p+1>p>0, and a decoder coupled to the I/O driver which receives the encoded m-bit parallel digital signals and performs a decoding operation to the encoded m-bit parallel digital signals, so as to restore the n-bit parallel digital signals.

A third respect of the present invention is directed to a signal transmission device which transmits n-bit parallel digital signals through an I/O driver to reduce simultaneous switching noise in an integrated circuit chip. The signal transmission device according to a third respect of the present invention includes: an encoder coupled to the I/O driver which receives the n-bit parallel digital signals and performs an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is limited within a range between p and (p+q) and the number of logic-0 bits of the encoded m-bit parallel digital signals is limited within a range between (m–p–q) and (m–p), where $(C_p^m + C_{p+1}^m + C_{p+2}^m + \ldots + C_{p+q}^m) > 2^n$ and m>p+q>q>0, and a decoder coupled to the I/O driver which receives the encoded m-bit parallel digital signals and performs a decoding operation to the encoded m-bit parallel digital signals, so as to restore the n-bit parallel digital signals.

The I/O driver preferably includes m I/O buffers each shares a common power bus and a common ground bus, and is coupled with the common power bus and the common ground bus through power/ground pads. The encoding operation is performed by encoding each bit of the n-bit parallel digital signals one by one into the encoded m-bit parallel digital signals in conformity with the above-described rule, and the decoding operation is substantially an inverse of the encoding operation.

A fourth respect of the present invention is directed to a signal transmission method for transmitting n-bit parallel digital signals through an I/O driver to minimize simultaneous switching noise in an integrated circuit chip, including the following steps of: performing an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is maintained at p and a number of logic-0 bits of the encoded m-bit parallel digital signals is maintained at (m–p), where $C_p^m > 2^n$ and m>p>0, and performing a decoding operation to the encoded m-bit parallel digital signals to restore the n-bit parallel digital signals.

A fifth respect of the present invention is directed to a signal transmission method for transmitting n-bit parallel digital signals through an I/O driver to minimize simultaneous switching noise in an integrated circuit chip, including the following steps of: performing an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is maintained at either p or p+1 and the number of logic-0 bits of the encoded m-bit parallel digital signals is maintained at either (m−p) or (m−p−1), where $(C_p^m + C_{p+1}^m) > 2^n$ and m>p+1>p>0, and performing a decoding operation to the encoded m-bit parallel digital signals to restore the n-bit parallel digital signals.

A sixth respect of the present invention is directed to a signal transmission method for transmitting n-bit parallel digital signals through an I/O driver to minimize simultaneous switching noise in an integrated circuit chip, including the following steps of: performing an encoding operation to the n-bit parallel digital signals to provide an encoded m-bit parallel digital signals for the I/O driver, where m>n and the encoding operation is performed by a rule that the number of logic-1 bits of the encoded m-bit parallel digital signals is limited within a range between p and (p+q) and the number of logic-0 bits of the encoded m-bit parallel digital signals is limited within a range between (m−p−q) and (m−p), where $(C_p^m + C_{p+1}^m + C_{p+2}^m + \ldots + C_{p+q-1}^m + C_{p+q}^m) > 2^n$ and m>p+q>q>0, and performing a decoding operation to the encoded m-bit parallel digital signals to restore the n-bit parallel digital signals.

According to a preferred embodiment of the present invention, the I/O driver is constituted by m I/O buffers each shares a common power bus and a common ground bus, and is coupled with the common power bus and the common ground bus through power/ground pads. The encoding operation is performed by encoding each bit of the n-bit parallel digital signals one by one into the encoded m-bit parallel digital signals in conformity with the above-described rule, and the decoding operation is substantially an inverse of the encoding operation.

A seventh respect of the present invention is directed to an integrated circuit chip having minimized simultaneous switching noise, including an internal circuit for generating n-bit parallel digital signals, an encoder coupled to the internal circuit for receiving the n-bit parallel digital signals and performing an encoding operation to the n-bit parallel digital signals to generate encoded m-bit parallel digital signals, where m>n and the encoding operation is performed by a rule that the number of logic-1 bits of the encoded m-bit parallel digital signals is maintained at p and the number of logic-0 bits of the encoded m-bit parallel digital signals is maintained at (m−p), where $C_p^m > 2^n$ and m>p>0, and m I/O pins coupled to the encoder for outputting the encoded m-bit parallel digital signals.

A eighth respect of the present invention is directed to an integrated circuit chip having minimized simultaneous switching noise, including an internal circuit for generating n-bit parallel digital signals, an encoder coupled to the internal circuit for receiving the n-bit parallel digital signals and performing an encoding operation to the n-bit parallel digital signals to generate encoded m-bit parallel digital signals, where m>n and the encoding operation is performed by a rule that the number of logic-1 bits of the encoded m-bit parallel digital signals is maintained at either p or p+1 and the number of logic-0 bits of the encoded m-bit parallel digital signals is maintained at either (m−p) or (m−p−1), where $(C_p^m + C_{p+1}^m) > 2^n$ and m>p+1>p>0, and m I/O pins coupled to the encoder for outputting the encoded m-bit parallel digital signals.

A ninth respect of the present invention is directed to an integrated circuit chip having minimized simultaneous switching noise, including an internal circuit for generating n-bit parallel digital signals, an encoder coupled to the internal circuit for receiving the n-bit parallel digital signals and performing an encoding operation to the n-bit parallel digital signals to generate encoded m-bit parallel digital signals, where m>n and the encoding operation is performed by a rule that the number of logic-1 bits of the encoded m-bit parallel digital signals is limited within a range between p and (p+q) and the number of logic-0 bits of the encoded m-bit parallel digital signals is limited within a range between (m−p−q) and (m−p), where $(C_p^m + C_{p+1}^m + C_{p+2}^m + \ldots + C_{p+q-1}^m + C_{p+q}^m) > 2^n$ and m>p+q>q>0, and m I/O pins coupled to the encoder for outputting the encoded m-bit parallel digital signals.

In accordance with a preferable implementation of the integrated circuit chip of the present invention, the I/O driver includes m I/O buffers each shares a common power bus and a common ground bus, and is coupled with the common power bus and the common ground bus through power/ground pads. In addition, the encoded m-bit parallel digital signals are transmitted to another one integrated circuit chip, including an I/O driver coupled to the m I/O pins for receiving the encoded m-bit parallel digital signals, a decoder coupled to the I/O driver for performing a decoding operation to the encoded m-bit parallel digital signals, so as to restore the n-bit parallel digital signals, and an internal circuit coupled to the decoder for processing with the n-bit parallel digital signals. Similarly, the I/O driver is constituted by m I/O buffers each shares a common power bus and a common ground bus, and is coupled with the common power bus and the common ground bus through wire-bond pads.

Now the foregoing and other features and advantages of the present invention will be more clearly understood through the following descriptions with reference to the accompanying drawings, in which:

DETAILED DESCRIPTION OF THE PREFERRED EMBODIMENT

Figure 1A:
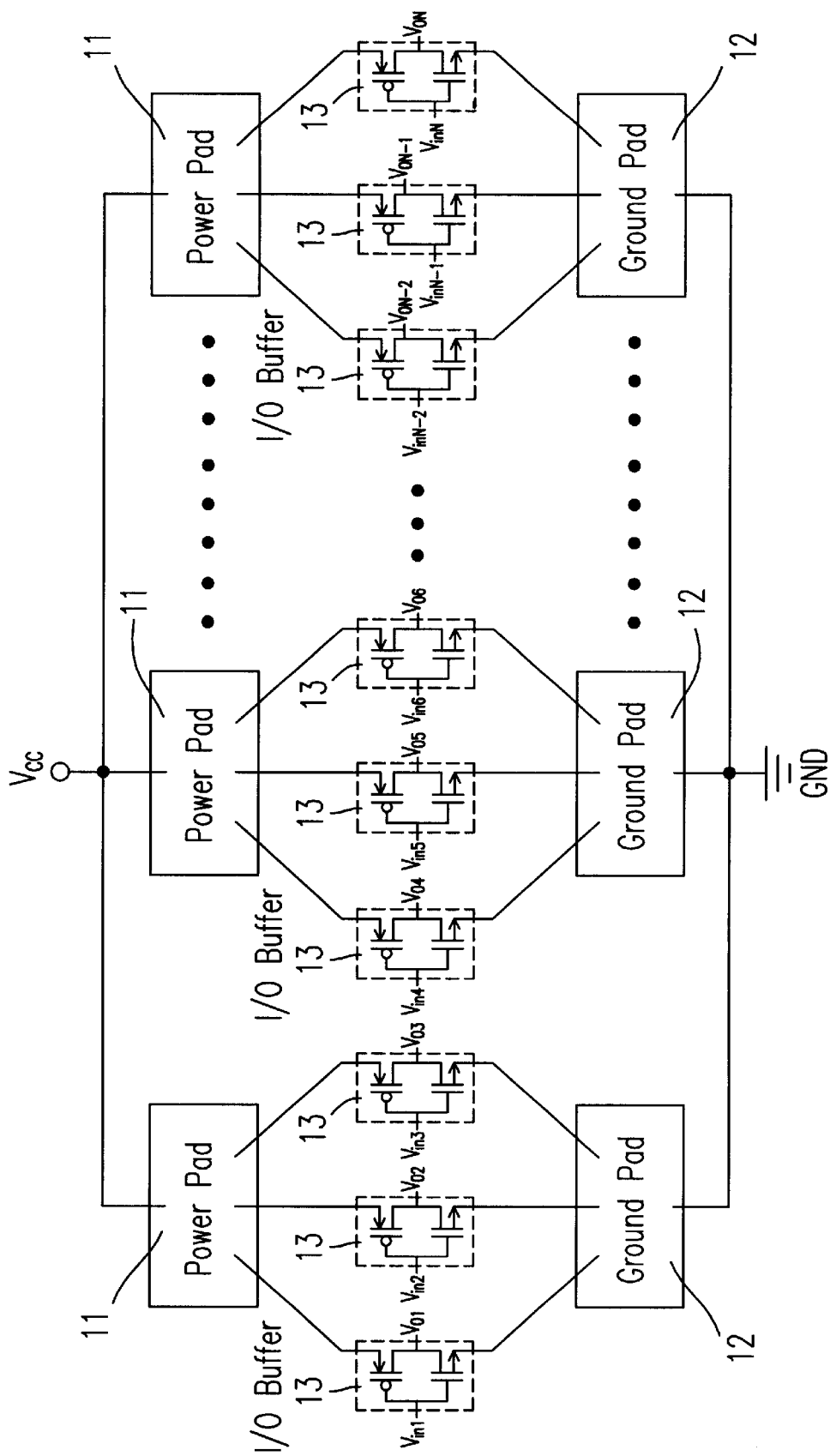
FIGS. 1(a) and 1(b) are plan views respectively showing an equivalent circuit in which a plurality of power pads and ground pads are used to interconnect an I/O driver including N I/O buffers with a common power bus $V_{CC}$ and a common ground bus GND, and an equivalent circuit of FIG. 1(a) in which the power pads and the ground pads are respectively represented by a parasitic inductor $L_1$ and a parasitic inductor $L_2$ as their parallel equivalent circuit element.
Figure 1B:
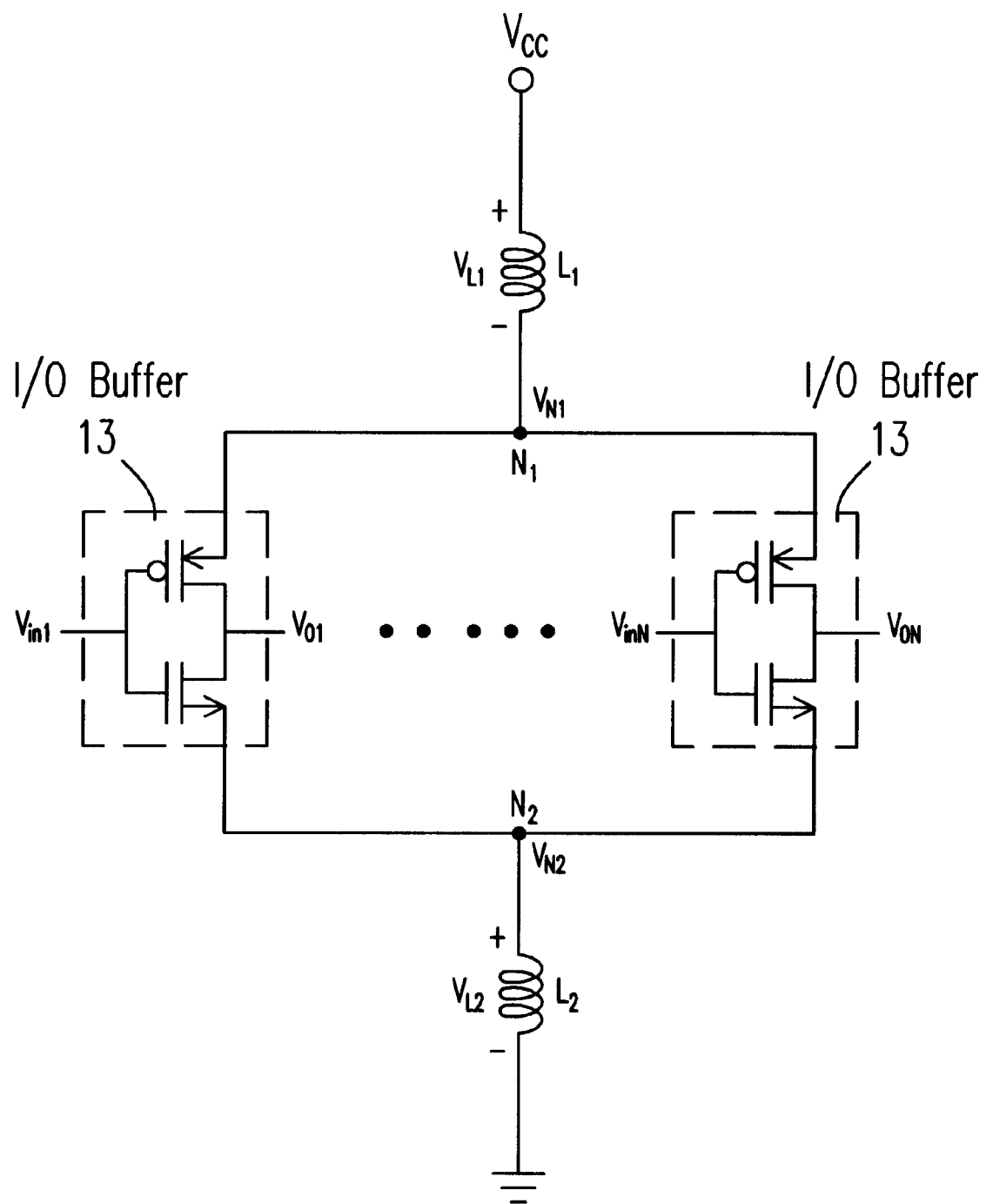
Figure 2:
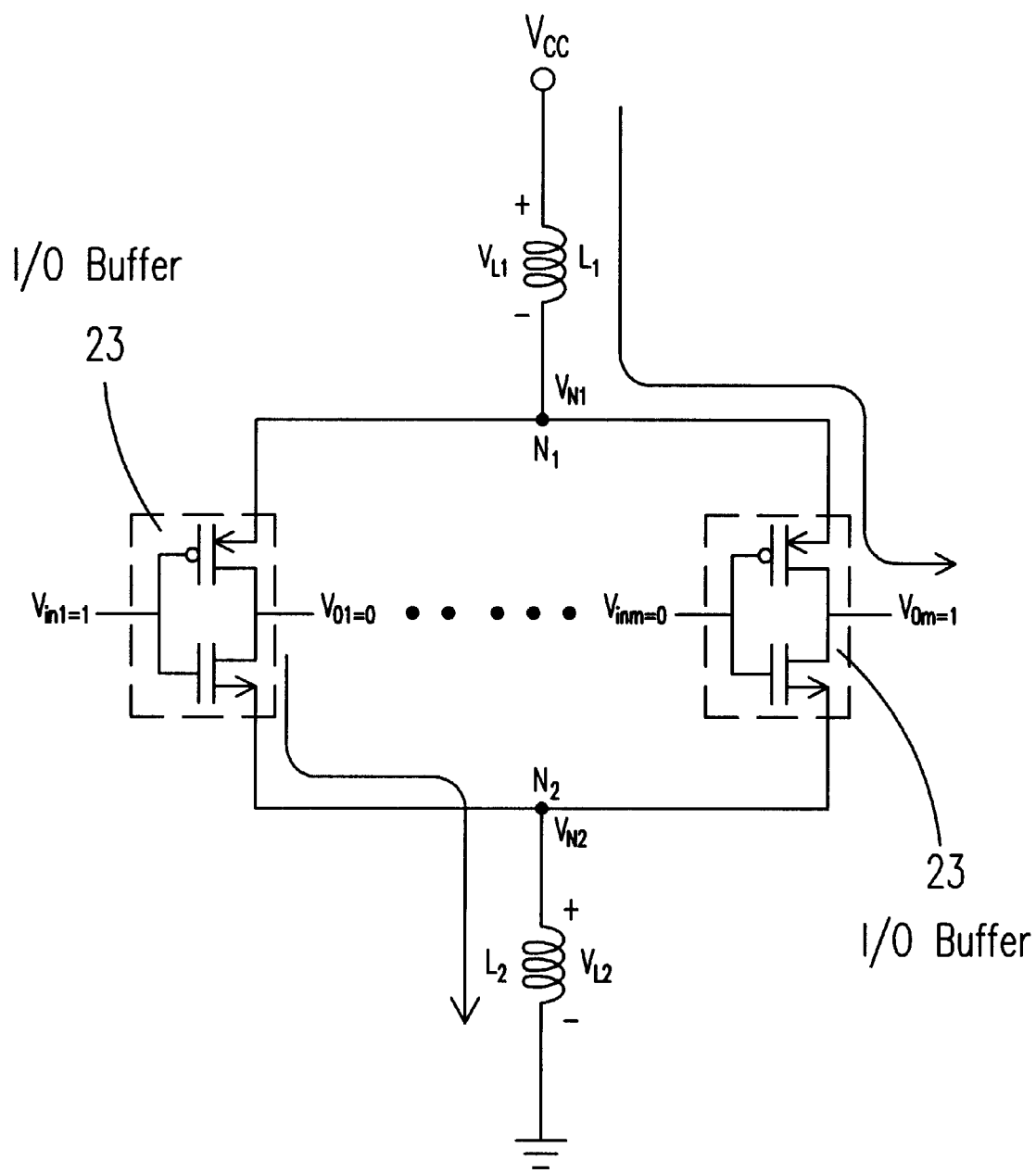
FIG. 2 is a parallel circuit diagram in which a plurality of power pads and ground pads are used to interconnect an I/O driver including m I/O buffers, wherein the power pads and the ground pads are respectively represented by a parasitic inductor $L_1$ and a parasitic inductor $L_2$ as their parallel equivalent circuit element.

A preferred embodiment of the present invention will now be addressed as follows. FIG. 2 shows an equivalent circuit diagram of an I/O driver including m I/O buffers 23 that are interconnected with a common power bus $V_{CC}$ and a common ground bus GND by a plurality of power pads and ground pads, wherein the power pads and the ground pads are respectively represented by a parasitic inductor $L_1$ and a parasitic inductor $L_2$ as their parallel equivalent circuit element. It can be clearly seen from FIG. 2 that the variation of the current flowing through the inductor $L_1$ will be varied in correspondence with the variation of the number of logic-1 bits of the input signal of I/O buffers 23 (which is illustrated by inverter gates in this preferred embodiment) Similarly, the variation of the current flowing through the inductor $L_2$ will be varied in correspondence with the variation of the number of logic-0 bits of the input signal of I/O buffers 23. Taking 8-bit parallel digital signals as an example of the input signal of the I/O buffers 23, when the input signal of the I/O buffers 23 changes from 11111111 to 00000000, the variation of the current flowing through the inductor $L_1$ will reach a maximum, and thereby the voltage $V_{L1}$ across the inductor $L_1$ will reach a maximum. On the contrary, when the input signals of the I/O buffers 23 changes from 00000000 to 11111111, the variation of the current flowing through the inductor $L_2$ reaches a maximum, so that the voltage $V_{L2}$ across the inductor $L_2$ will reach a maximum.

On the basis of the foregoing deliberations, it is found that the number of logic-1 bits or logic-0 bits that are switching logic states frequently is the major reason for generating ground/power bounce on the actual bias voltage $(V_{N1}-V_{N2})$. In order to minimize the simultaneous switching noise generated from the simultaneous switching operations of the I/O driver in an integrated circuit chip, the number of simultaneous switching outputs must be carefully limited. It is appreciated that if an attempt is made to limit the number of logic-1 bit or logic-0 bits of the input signal of the I/O buffers 23 within a fixed range or to a fixed value, it is likely to minimize or even eliminate the simultaneous switching noise in an integrated circuit chip.

Figure 3:
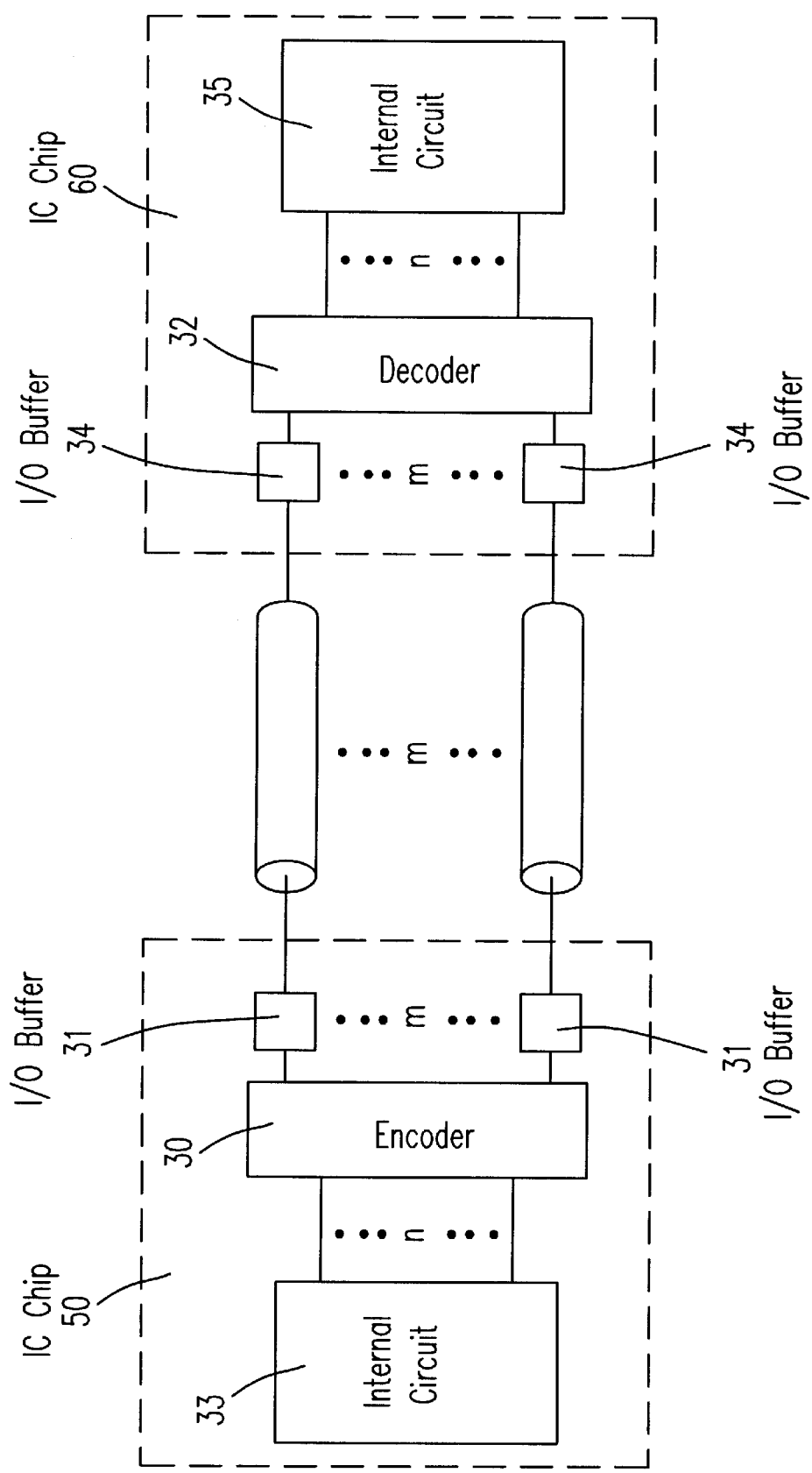
FIG. 3 is a circuit block diagram showing the signal transmission devices of a preferred embodiment of the present invention being respectively implemented in two integrated circuit chips for signal transmission.

FIG. 3 shows a circuit block diagram that the signal transmission devices according to a preferred embodiment of the present invention are respectively implemented in two IC chips. In integrated circuit chip 50, there is provided an encoder 30 having n inputs and m outputs for performing an encoding operation to encode the n-bit parallel digital signals generated by the internal circuit 33 into encoded m-bit parallel digital signals, and the encoded m-bit parallel digital signals is provided for the I/O buffers 31. The encoding rule of the encoding operation can be made in such a way that the number of logic-1 bits of the encoded m-bit parallel digital signals is maintained at p and the number of logic-0 bits of the encoded m-bit parallel digital signals is maintained at (m−p), where $C_p^m>2^n$ and m>p>0. For example, if n=16, m=19, p=9 (or p=10), the original 16-bit parallel digital signals will be encoded into 19-bit encoded parallel digital signals through the encoding operation by the encoder 30, and the encoded 19-bit parallel digital signals will be transmitted to the nineteen I/O buffers 31. Because the encoding operation is performed by a rule that the number of logic-1 bits of the encoded 19-bit parallel digital signals is maintained at 9 and the number of logic-0 bits of the encoded 19-bit parallel digital signals is maintained at 10 (or the number of logic-1 bits of the encoded 19-bit parallel digital signals is maintained at 10 and the number of logic-0 bits of the encoded 19-bit parallel digital signals is maintained at 9), the number of logic-1 bits and the number of logic-0 bits of the encoded 19-bit parallel digital signals will be settled down. In this way, the number of logic-1 bits and the number of logic-0 bits of the encoded 19-bit parallel digital signals will not be changed any more. On the condition that all the I/O buffers 31 are simultaneously switching logic states, the ground/power bounce on the actual bias voltage $(V_{N1}-V_{N2})$ of the I/O buffers 31 is able to be thoroughly eliminated, and thereby the drawbacks of the power/ground noise generated in power and ground buses according to the prior art can be obviated. In integrated circuit chip 60, there is provided a decoder 32 for receiving the encoded m-bit parallel digital signals from the I/O buffers 34 and performing a decoding operation to the encoded m-bit parallel digital signals to restore the n-bit parallel digital signals. The decoded n-bit parallel digital signals are provided for the internal circuit 35 for later data processing operations. Because the n-bit digital signals can be used to generate $2^n$ logic combinations, the selection of m and p has to be conformable to the constraints of $C_p^m>2^n$ and m>p>0, so as to hold the data in the original n-bit parallel digital signals.

Further, in order to increase the possible logic combination of the encoded m-bit parallel digital signals, the encoding rule of the encoding operation executed by the encoder 30 can be modified to maintain the number of the logic-1 bits of the encoded m-bit parallel digital signals at either p or p+1, and maintain the number of the logic-0 bits of the encoded m-bit parallel digital signals at either m−p or m−p−1, where $(C_p^m+C_{p+1}^m)>2^n$ and m>p+1>p>0. The decoding operation executed by the decoder 32 is substantially an inverse of the encoding operation. Thus the value of (m−n) can be reduced, which indicates that the added bit number of the encoded m-bit parallel digital signals to the original n-bit parallel digital signals does not need to be too large. Nonetheless, in this manner the number of logic-1 bits (or logic-0 bits) of the encoded m-bit parallel digital signals can not be limited to a fixed value, but can be limited within a fixed range. Based upon this concept that the number of logic-1 bits (or logic-0 bits) of the encoded m-bit parallel digital signals can be limited within a fixed range instead of limited to a fixed value, the encoding rule of the encoding operation executed by the encoder 30 can be further stretched so that the number of logic-1 bits of the encoded m-bit parallel digital signals is limited within a range between p and (p+q) and the number of logic-0 bits of the encoded m-bit parallel digital signals is limited within a range between (m−p) and (m−p−q), where $(C_p^m+C_{p+1}^m+C_{p+2}^m+...+C_{p+q-1}^m+C_{p+q}^m)>2^n$ and m>p+q>q>0. Nevertheless, the decoding operation executed by the decoder 32 is substantially an inverse of the encoding operation, and the simultaneous switching noise can be minimized as well.

In conclusion, the techniques as already disclosed in the present invention is able to efficiently minimize simultaneous switching noise in an integrated circuit chip, and the abnormal operations of the I/O buffers can be avoided. It can be readily understood that with the utilization of the present invention, the simultaneous switching noise can be controlled as low as possible. Moreover, because the ground/power bounce problem resulting from the inductance effect on the wire-bond pads can be efficiently suppressed, more signal pins can share a common power pad and a common ground pad, and the power/ground pins of the integrated circuit chip can be slashed. As a result, the total pin number of the integrated circuit chip will not increase anymore.

Those of skill in the art will recognize that these and other modifications can be made within the spirit and scope of the present invention as further defined in the appended claims.

What is claim is:

1. A signal transmission device which transmits n-bit parallel digital signals through an I/O driver to reduce simultaneous switching noise in an integrated circuit chip, comprising:

an encoder coupled to said I/O driver which receives said n-bit parallel digital signals and performs an encoding operation to said n-bit parallel digital signals to provide an encoded m-bit parallel digital signals for said I/O driver, where m>n and said encoding operation is performed by a rule that a number of logic-1 bits of said encoded m-bit parallel digital signals is maintained at p and a number of logic-0 bits of said encoded m-bit parallel digital signals is maintained at (m−p), where $C_p^m > 2^n$ and m>p>0; and a decoder coupled to said I/O driver which receives said encoded m-bit parallel digital signals and performs a decoding operation to said encoded m-bit parallel digital signals, so as to restore said n-bit parallel digital signals.

2. The signal transmission device as recited in claim 1 wherein said I/O driver comprises m I/O buffers each shares a common power bus and a common ground bus.

3. The signal transmission device as recited in claim 2 wherein said m I/O buffers are coupled with said common power bus and said common ground bus through wire-bond pads.

4. The signal transmission device as recited in claim 1 wherein said encoding operation is performed by encoding each bit of said n-bit parallel digital signals one by one into said encoded m-bit parallel digital signals in conformity with said rule.

5. The signal transmission device as recited in claim 4 wherein said decoding operation is substantially an inverse of said encoding operation.

6. A signal transmission device for transmitting n-bit parallel digital signals through an I/O driver to minimize simultaneous switching noise in an integrated circuit chip, comprising:

an encoder coupled to said I/O driver which receives said n-bit parallel digital signals and performs an encoding operation to said n-bit parallel digital signals to provide an encoded m-bit parallel digital signals for said I/O driver, where m>n and said encoding operation is performed by a rule that a number of logic-1 bits of said encoded m-bit parallel digital signals is limited within a range between p and (p+q) and a number of logic-0 bits of said encoded m-bit parallel digital signals is limited within a range between (m−p−q) and (m−p), where $(C_p^m + C_{p+1}^m + C_{p+2}^m + \ldots + C_{p+q-1}^m + C_{p+q}^m) > 2^n$ and m>p+q>q>0; and a decoder coupled to said I/O driver which receives said encoded m-bit parallel digital signals and performs a decoding operation to said encoded m-bit parallel digital signals, so as to restore said n-bit parallel digital signals.

7. The signal transmission device as recited in claim 6 wherein said I/O driver comprises m I/O buffers each shares a common power bus and a common ground bus.

8. The signal transmission device as recited in claim 7 wherein said m I/O buffers are coupled with said common power bus and said common ground bus through wire-bond pads.

9. The signal transmission device as recited in claim 6 wherein said encoding operation is performed by encoding each bit of said n-bit parallel digital signals one by one into said encoded m-bit parallel digital signals in conformity with said rule.

10. The signal transmission device as recited in claim 9 wherein said decoding operation is substantially an inverse of said encoding operation.

11. A signal transmission method for transmitting n-bit parallel digital signals through an I/O driver to minimize simultaneous switching noise in an integrated circuit chip, said method comprising:

performing an encoding operation to said n-bit parallel digital signals to provide an encoded m-bit parallel digital signals for said I/O driver, where m>n and said encoding operation is performed by a rule that a number of logic-1 bits of said encoded m-bit parallel digital signals is maintained at p and a number of logic-0 bits of said encoded m-bit parallel digital signals is maintained at (m−p), where $C_p^m > 2^n$ and m>p>0; and performing a decoding operation to said encoded m-bit parallel digital signals to restore said n-bit parallel digital signals.

12. A signal transmission method for transmitting n-bit parallel digital signals through an I/O driver to minimize simultaneous switching noise in an integrated circuit chip, said method comprising:

performing an encoding operation to said n-bit parallel digital signals to provide an encoded m-bit parallel digital signals for said I/O driver, where m>n and said encoding operation is performed by a rule that a number of logic-1 bits of said encoded m-bit parallel digital signals is limited within a range between p and (p+q) and a number of logic-0 bits of said encoded m-bit parallel digital signals is limited within a range between (m−p−q) and (m−p), where $(C_p^m + C_{p+1}^m + C_{p+2}^m + \ldots + C_{p+q-1}^m + C_{p+q}^m) > 2^n$ and m>p+q>q>0; and performing a decoding operation to said encoded m-bit parallel digital signals to restore said n-bit parallel digital signals.

13. An integrated circuit chip having minimized simultaneous switching noise comprising:

an internal circuit for generating n-bit parallel digital signals;

an encoder coupled to said internal circuit for receiving said n-bit parallel digital signals and performing an encoding operation to said n-bit parallel digital signals to generate encoded m-bit parallel digital signals, where m>n and said encoding operation is performed by a rule that a number of logic-1 bits of said encoded m-bit parallel digital signals is maintained at p and a number of logic-0 bits of said encoded m-bit parallel digital signals is maintained at (m−p), where $C_p^m > 2^n$ and m>p>0; and m I/O pins coupled to said encoder for outputting said encoded m-bit parallel digital signals.

14. The integrated circuit chip as recited in claim 13 further comprising an I/O driver coupled between said encoder and said m I/O pins.

15. The integrated circuit chip as recited in claim 14 wherein said I/O driver comprises m I/O buffers each shares a common power bus and a common ground bus.

16. The integrated circuit chip as recited in claim 15 wherein said m I/O buffers are coupled with said common power bus and said common ground bus through wire-bond pads.

17. The integrated circuit chip as recited in claim 13 wherein said encoded m-bit parallel digital signals are transmitted to another one integrated circuit chip comprising:

an I/O driver coupled to said m I/O pins for receiving said encoded m-bit parallel digital signals;

a decoder coupled to said I/O driver for performing a decoding operation to said encoded m-bit parallel digital signals, so as to restore said n-bit parallel digital signals; and an internal circuit coupled to said decoder for processing with said n-bit parallel digital signals.

18. The integrated circuit chip as recited in claim 17 wherein said I/O driver comprises m I/O buffers each shares a common power bus and a common ground bus.

19. The integrated circuit chip as recited in claim 18 wherein said m I/O buffers are coupled with said common power bus and said common ground bus through wire-bond pads.

20. The integrated circuit chip as recited in claim 17 wherein said decoding operation is substantially an inverse of said encoding operation.

21. An integrated circuit chip having minimized simultaneous switching noise comprising:

an internal circuit for generating n-bit parallel digital signals;

an encoder coupled to said internal circuit for receiving said n-bit parallel digital signals and performing an encoding operation to said n-bit parallel digital signals to generate encoded m-bit parallel digital signals, where m>n and said encoding operation is performed by a rule that a number of logic-1 bits of said encoded m-bit parallel digital signals is limited within a range between p and (p+q) and a number of logic-0 bits of said encoded m-bit parallel digital signals is limited within a range between (m−p−q) and (m−p), where $(C_p^m + C_{p+1}^m + C_{p+2}^m + \ldots + C_{p+q-1}^m + C_{p+q}^m) > 2^n$ and m>p+q>q>0; and m I/O pins coupled to said encoder for outputting said encoded m-bit parallel digital signals.

22. The integrated circuit chip as recited in claim 21 further comprising an I/O driver coupled between said encoder and said m I/O pins.

23. The integrated circuit chip as recited in claim 22 wherein said I/O driver comprises m I/O buffers each shares a common power bus and a common ground bus.

24. The integrated circuit chip as recited in claim 23 wherein said m I/O buffers are coupled with said common power bus and said common ground bus through wire-bond pads.

25. The integrated circuit chip as recited in claim 21 wherein said encoded m-bit parallel digital signals are transmitted to another one integrated circuit chip comprising:

an I/O driver coupled to said m I/O pins for receiving said encoded m-bit parallel digital signals;

a decoder coupled to said I/O driver for performing a decoding operation to said encoded m-bit parallel digital signals, so as to restore said n-bit parallel digital signals; and an internal circuit coupled to said decoder for processing with said n-bit parallel digital signals.

26. The integrated circuit chip as recited in claim 25 wherein said I/O driver comprises m I/O buffers each shares a common power bus and a common ground bus.

27. The integrated circuit chip as recited in claim 26 wherein said m I/O buffers are coupled with said common power bus and said common ground bus through wire-bond pads.

28. The integrated circuit chip as recited in claim 25 wherein said decoding operation is substantially an inverse of said encoding operation.

* * * * *